United States Patent [19]

Shiraki et al.

[11] Patent Number: 5,036,319
[45] Date of Patent: Jul. 30, 1991

[54] MAGNETIC ENCODER USING MAGNETORESISTIVE ELEMENT

[75] Inventors: Manabu Shiraki, Yamato; Osami Miyao, Sagamihara; Shoji Fujisawa; Shunji Kawashima, both of Yamato, all of Japan

[73] Assignee: Shicoh Engineering Co., Ltd., Kanagawa, Japan

[21] Appl. No.: 632,627

[22] Filed: Dec. 26, 1990

Related U.S. Application Data

[63] Continuation of Ser. No. 367,136, Jun. 16, 1989, abandoned.

[30] Foreign Application Priority Data

Jun. 20, 1988 [JP] Japan .................. 150361/1988

[51] Int. Cl.$^5$ ............................................. H03M 1/30
[52] U.S. Cl. ...................................... 341/115; 341/11
[58] Field of Search ....................... 341/6, 8, 11, 15

[56] References Cited

U.S. PATENT DOCUMENTS

| | | | |
|---|---|---|---|
| 4,029,899 | 6/1977 | Gordon | 341/15 |
| 4,768,119 | 6/1988 | Iijima et al. | 341/15 |
| 4,774,464 | 9/1988 | Kubota et al. | 341/15 |

Primary Examiner—J. R. Scott
Assistant Examiner—Marc S. Hoff
Attorney, Agent, or Firm—Wegner, Cantor, Mueller & Player

[57] ABSTRACT

An magnetic encoder includes a multipolar magnetic body having a row of alternate North and South poles of equal widths, and a magnetoresistive element diposed in confrontation to the multipolar magnetic body. The magnetoresistive element includes at least one A phase magnetoresistive element member and at least one B phase magnetoresisitve element disposed in juxtaposition over $$\frac{(2n+1)}{2} \cdot \lambda$$

where n is an integer greater than or equal to 1, and $\lambda$ is a width of each individual pole of the multiplar magnetic body. Each of the A phase magnetoresistive element members and the B phase magnetoresistive element member has a group of series connected linear conductors arranged side-by-side into a comb-like shape. The A phase magnetoresistive element member extends over $$\frac{(2n+1)}{4} \cdot \lambda,$$

and the B phase magnetoresistive element member is out of phase with the A phase magnetoresistive element member by $$\frac{(2n+1)}{4} \cdot \lambda.$$

2 Claims, 9 Drawing Sheets

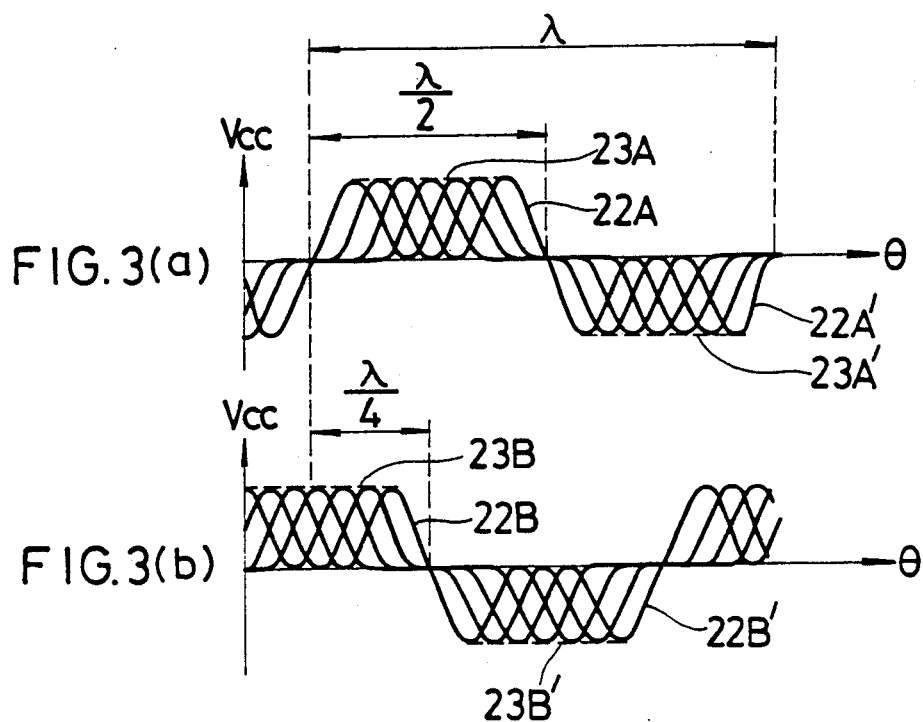
FIG. 3(a)
FIG. 3(b)
FIG. 4
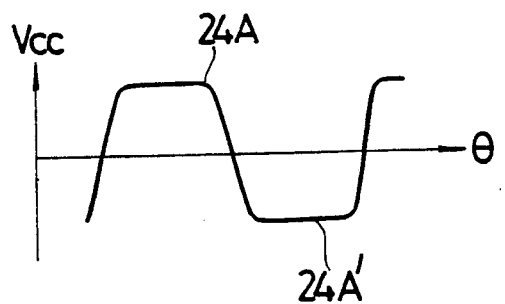
FIG. 5
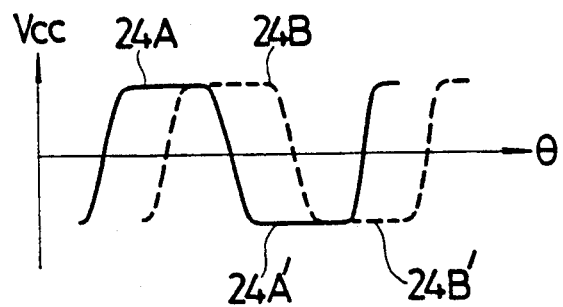

FIG. 11
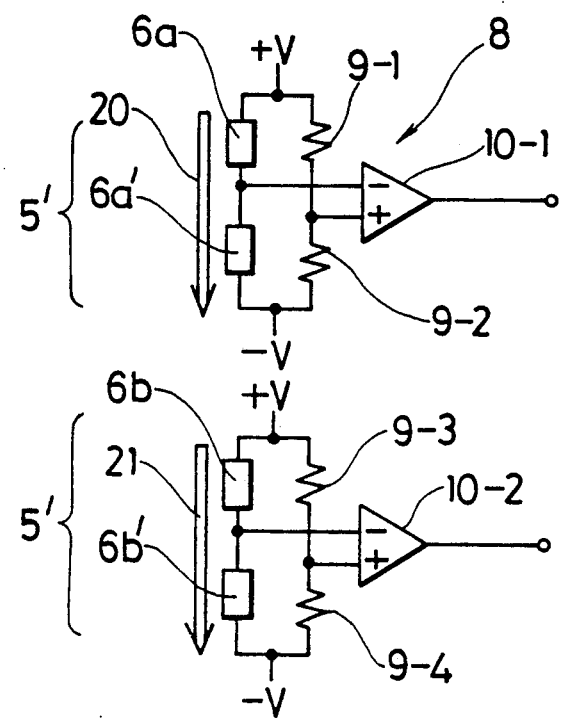
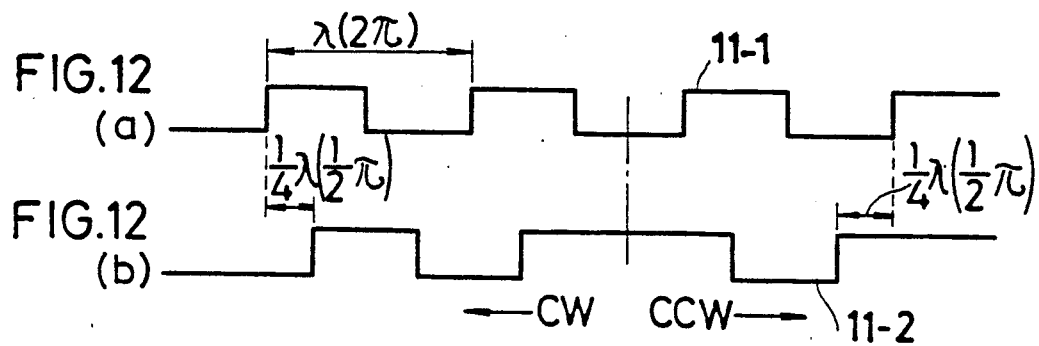
FIG.12 (a)
FIG.12 (b)

MAGNETIC ENCODER USING MAGNETORESISTIVE ELEMENT

This application is a continuation of U.S. application Ser. No. 07/367,136, filed June 16, 1989, now abandoned.

BACKGROUND OF THE INVENTION

1. Field of the Invention

The present invention relates generally to magnetic encoders for automatic apparatus, and more particularly to such a magnetic encoder which is highly precise and suitable for use with a power source comprising a battery. This invention may be practiced in the form of a rotary type encoder or a linear type encoder.

2. Description of the Prior Art

Encoders are widely used in an automatic apparatus for positioning a movable part of the apparatus. The encoders measure a moving distance of the part in terms of an angle of rotation of a shaft of a motor, for example, and translate the measured angle into an electric code signal.

The encoders are classified into rotary type encoders and linear type encoders. The rotary type encoders are further classified into the incremental type measuring the number of pulses produced upon rotation, and the absolute type reading recorded codes from a rotor. In terms of the detecting method, the encoders are divided into the optical type and the magnetic type. In recent years, the incremental type magnetic encoder are widely used in view of their low manufacturing cost and high reliability.

One example of conventional rotary magnetic encoders is illustrated in FIG. 6 of the accompanying drawings. The illustrated encoder 1 includes a multipolar magnet rotor 3 having a row of alternate North and South poles 2N and 2S formed on the periphery of the magnet rotor 3 at a fine pole pitch, and a magnetoresistive element 5 (so-called MR sensor) disposed in confrontation to the periphery of the magnet rotor 3 with an air gap 4 defined therebetween. The magnet rotor 3 may be formed of a single magnetic body, or a rotor drum having a magnetic layer coated on its peripheral surface.

Each of the North and South poles 2N, 2S has a width λ which is equal to an electric angle of 360° or 2π radian. The magnetoresistive element 5 is formed of a ferromagnetic material having the magnetoresistive effect.

The principle of the magnetic encoder of the foregoing construction will be described with reference to FIG. 7. The ferromagnetic magnetoresistive element 5 comprises a conductor (i.e., magnetoresistive member) 6 composed of a film of ferromagnetic material having an effect of magnetoresistance.

The conductor 6 formed a film of a strip of ferromagnetic metal such as nickel-cobalt having a thickness of several thousands Å is formed on a base plate of glass by vacuum evaporation method or by an etching method.

When the conductor 6 is disposed over the multipolar magnetic body 3 as shown in FIG. 7, the magnetic flux extends from a North pole 2N and an adjacent South pole 2S in a direction perpendicular to the direction of an electric current flowing through the conductor 6. In this instance, the resistance of the conductor is caused to decrease by a magnetic flux 7X extending predominantly in a transverse direction of the conductor 6 as shown in FIG. 8. Designated by 7Y is a magnetic flux extending in a direction perpendicular to the plane of the conductor 6. The rate of change in the resistance of the conductor is several %.

If the conductor 6 is disposed at a phase $\theta$ with respect to the respective pole 2N or 2S having a width λ equal to an electric angle of 360° or 2π radian, then a resistance $R(\theta)$ of the conductor is represented by the following equation:

$$R(\theta) = R - \Delta r \cdot \cos \theta$$

where R is a resistance of the conductor 6 at a position λ/4 or 3λ/4, $\Delta r$ is a rate of change of the resistance.

The magnitude of the transverse magnetic flux 7X varies with the phase $\theta$, the conductor 6 and the width of the individual magnetic pole. The resistance R of the conductor 6 varies with the magnitude of the transverse magnetic flux 7.

In the case of the magnetoresistive element 5, as opposed to other types of magnetic sensor, an output signal from the magnetoresistive element 5 does not change at a center of the magnetic field (i.e., at the middle of the individual pole 2N, 2S) due to the absence of the transverse magnetic flux at the center of the magnetic field.

The above-mentioned magnetoresistive element 5 composed of a single conductor 6 is not practical. Accordingly, a conventionally used magnetoresistive element 5' as shown in FIG. 9 has two series connected conductors 6a, 6a' spaced from each other by a distance λ, each conductor 6a, 6a' being composed of two conductor portions connected at one end and folded into a U-shape.

The U-shaped conductors 6a, 6a' spaced by the width λ of each pole are 180 degrees out of phase. An output terminal 12 is connected to a connecting point of the conductors 6a, 6a'. One end of the conductor 6a is connected to a current supply terminal 13 which in turn is connected to the positive side of a power source 14. One end of the conductor 6a' is connected to another current supply terminal 15 connected to the negative side of another power source 16. Output from the magnetoresistive element 5' is led out from output terminals 18-1, 18-2, the output terminal 18-1 being connected to the output terminal 12 while the output terminal 18-2 is connected to a connecting point 17 between the power sources 14, 16.

With the magnetoresistive element 5' thus constructed, the resistance of the conductors 6a, 6a' decreases in response to a component of the magnetic field extending parallel to the magnetic face of the magnet rotor 3.

This magnetic field component is maximum at a border between two adjacent poles of the magnetic rotor 3 and is equal to zero at the midpoint of each pole. As a consequence, the polarity of the conductors 6a, 6a' spaced by a distance λ/2 changes upon rotation of the magnet rotor 3, so that the number of rotation of the magnet rotor 3 can be measured by counting through the output terminals 18-1, 8-2 the number of times when the potential at the midpoint between the conductors 6a, 6a' becomes zero.

In the case of the magnetoresistive element 5' having the conductors 6a, 6a', a change in the potential at the midpoint between the conductors 6a, 6a' is indicated by an output signal wave form 22, 22' which tends to have a relatively small width. This tendency becomes marked as the spacing between the magnet rotor 3 and the magnetoresistive element 5' is reduced.

Since the output signal having such a narrow wave form includes a large component of nearly zero potential, a measurement of the zero potential points is likely to contain an error due to fluctuation of a reference voltage particularly when detected analog signals are converted into digital signals. The magnetoresistive element is likely to operate improperly when subjected to noise.

The magnetoresistive elements 5' does not produce a magnetic encoder signal of an A phase and a magnetic encoder signal of a B phase which is 90 degrees out of phase with respect to the A phase magnetic encoder signal. In order to obtain both of the A phase encoder signal and the B phase encoder signal, The magnetoresistive element 5' is combined with an additional magnetoresistive element 5' (not shown) disposed at a distance $\lambda/4$ from the first-mentioned magnetoresistive element 5'. The additional magnetoresistive element 5' includes two conductors (not shown but designated by 6b, 6b' for purposes of explanation) which correspond to the conductors 5a, 5a', respectively.

In the two magnetoresistive elements 5', 5', the conductors 6a, 6a' are used for producing an A phase encoder signal while the conductors 6b, 6b' are used for producing a B phase encoder signal. The conductors 6a, 6a' are 180 degrees out of phase with each other. Likewise, the conductors 6b, 6b' are 180 degrees out of phase. Thus, the conductors 6a, 6a' or 6b, 6b' are shifted or spaced by a distance equal to $n\lambda+\lambda/4$ (n is an integer greater than or equal to 1).

The magnetic encoder signals produced from the magnetoresistive elements 5' are processed by a circuit shown in FIG. 11.

The signal processing circuit 8 for a magnetic encoder having the two magnetoresistive elements 5' includes four resistors 9-1, 9-2, 9-3, 9-4 each connected in series with one of the magnetoresistive elements 5' so as to form two bridging circuits for translate a change in the resistance into a change in the voltage, and two voltage comparators 10-1, 10-2 each connected with a corresponding one of the bridging circuits, thereby obtaining two encoder signals 11-1, 11-2 of rectangular wave forms which are 90 degrees out of phase, as shown in FIGS. 12(a) and 12(b).

An angle of rotation of the encoder can be obtained by counting the number of encoder signals 11-1, 11-2 of rectangular wave forms.

In the signal processing circuit 8 including the magnetoresistive elements 5' shown in FIG. 11, the output voltage appearing at the midpoint potential or the connecting point between the conductors 6a and 6a'(6b, 6b') is used as a magnetic encoder signal output.

The magnetic encoder having the magnetoresistive elements 5' described above has a drawback because the measurement is achieved in such a manner as to count respective portions of the output signal wave forms extending across the zero level. Such a measurement is likely to be negatively affected by fluctuation of a reference voltage particularly when the output wave forms are converted into digital signals. The measurement is susceptible to noise and the magnetoresistive element is likely to operate incorrectly with the result that precise magnetic encoder signals are difficult to obtain.

With the foregoing drawbacks in view, various attempts have been made by the present inventor and almost satisfactory results have been obtained by a magnetic encoder of a construction described below. The magnetic encoder includes a multipolar magnet rotor having a row of alternate North and South poles of equal widths, and a magnetoresistive element disposed in confronting relation to the periphery of the multipolar magnetic rotor. The magnetoresistive element includes a group of series connected conductors arranged in a comb-like shape and having the magnetoresistive effect, the conductor group being disposed over a width $(2n+1)\lambda$ where n is an integer greater than or equal to 0 and $\lambda$ is a width of each individual magnetic pole. An output terminal is connected to the midpoint of the group of conductors for outputting a magnetic encoder signal. The encoder signal thus produced has a substantially rectangular wave form or a trapezoidal wave form.

Since the series of conductor groups having the magnetoresistive effect are arranged in side-by-side juxtaposition at a pitch equal to $(2n+1)\lambda$, the magnetoresistive element has a relative small area and hence is compact as a whole, and can be manufactured at a low cost.

FIG. 13 illustrates a magnetoresistive element 19 used in a magnetic encoder. Illustrated magnetoresistive element 19 includes a magnetoresistive element member 19A for producing a magnetic encoder signal for an A phase and a magnetoresistive element member 19b for producing a magnetic encoder signal for a B phase.

The magnetoresistive element 19 is so constructed as to produce an A phase magnetic encoder signal and a B phase magnetic encoder signal which is out of phase with respect to the A phase magnetic encoder signal by $n+\lambda/4$ where n is an integer greater than or equal to 1 and given independently of an integer n described later on, and $\lambda$ is a width of each magnetic pole of a multipolar magnetic body. In the illustrated embodiment, $n=1$ so that the B phase magnetic encoder signal is out of phase by $\lambda+\lambda/4$ with respect to the A phase magnetic encoder signal. To this end, the magnetoresistive element member 19A for the A phase includes a group of series connected linear conductors having the magnetoresistive effect and arranged side-by-side into a comb-like shape. And, the magnetoresistive element member 19B for the B phase includes a group of series connected linear conductors having the magnetoresistive effect and arranged side-by-side into a comb-like shape. The B phase magnetoresistive element member 19B is disposed out of phase by $n\lambda+\lambda/4$ with respect to the A phase magnetoresistive element member 19A where n is an integer greater than or equal to 1. In the illustrated embodiment, $n=1$, so that the B phase magnetoresistive element member 18B is out of phase by by $\lambda+\lambda/4$ with respect to the A phase magnetoresistive element member 19A. The magnetoresistive element members 19A, 19B are formed on a base plate 25 of glass by the vacuum evaporation method or the etching method described above.

The A phase magnetoresistive element member 19A and the B phase magnetoresistive element 19B are preferably deposited on the base plate 25 by the vacuum evaporation method so as to form a single magnetoresistive element. Alternatively, the magnetoresistive elements 19A and 19B may be formed on different base plates, then they are disposed $n\lambda+\lambda/4$ out of phase with each other, thereby forming the magnetoresistive element 19.

The magnetoresistive element 19 may include two or more pairs of the A phase magnetoresistive element member 19A and the B phase magnetoresistive element member 19B, regardless of whether or not they have a common base plate. The magnetoresistive element member 19A constituting a part of the magnetoresistive element 19 is composed of a group of series connected conductors arranged side-by-side in a comb-like shape, the conductors 20 being disposed over a magnetic pole width $(2n+1)\lambda$ where n is an integer greater than or equal to zero and $\lambda$ is a width of each individual magnetic pole. If $n=0$, then the conductor group 20 is disposed over a single magnetic pole width. An output terminal 12A is connected to one end of a conductor 20' which is disposed at the middle of the conductor group 20 as viewed from the direction of rotation of the magnet rotor 3. The output terminal 12A divides the conductor group 20 into two subgroups of conductors. The left conductor subgroup formed over a width $\lambda/2$ constitutes a magnetoresistive element member 21A while the right conductor subgroup formed over a width $\lambda/2$ constitutes a magnetoresistive element member 21A'.

The magnetoresistive element member 19B constituting a part of the magnetoresistive element 19 is composed of a group of series connected conductors arranged side-by-side in a comb-like shape, the conductors 20 being disposed over a magnetic pole width $(2n+1)\lambda$ where n is an integer greater than zero and $\lambda$ is a width of each individual magnetic pole. If $n=0$, then the conductor group 20 is disposed over a single magnetic pole width. An output terminal 12A is connected to one end of a conductor 20' which is disposed at the middle of the conductor group 20 as viewed from the direction of rotation of the magnet rotor 3. The output terminal 12A divides the conductor group 20 into two subgroups of conductors. The left conductor subgroup formed over a width $\lambda/2$ constitutes a magnetoresistive element member 21B while the right conductor subgroup formed over a width $\lambda/2$ constitutes a magnetoresistive element member 21B'.

With this arrangement, the magnetoresistive element member 19A composed of above-mentioned two magnetoresistive element members 21A, 21A' and the magnetoresistive element member 19B composed of the above-mentioned two magnetoresistive elements 21B, 21B' are out of phase with each other by $n\lambda + \lambda/4$.

The magnetoresistive element members 21A and 21A' are 180 degrees out of phase with each other, while the magnetoresistive element members 21B and 21B' are 180 degrees out of phase with each other.

One end of the last conductor of the magnetoresistive element member 21A is connected to one end of the first conductor of the magnetoresistive element member 21A'. Accordingly, the magnetoresistive element members 21A and 21A' are connected in series with each other. The output terminal 12A is connected to a connecting point between the two magnetoresistive element members 21A, 21A'. One end of the first conductor of the magnetoresistive element member 21A is connected to a current supply terminal 13A which is in turn connected to the positive side of a power source such as a battery 14A. One end of the last conductor of the magnetoresistive element member 21A' is connected to a current supply terminal 15A which in turn is connected to the negative side of a power source such as a battery 16A. An output terminal 18A-1 is connected to the output terminal 12A and another output terminal 18A-2 is connected to a connecting point 17A between the negative side of the power battery 14A and the positive side of the power battery 16A. An A phase magnetic encoder output appears between the output terminals 18A-1 and 18A-2.

Likewise, one end of the last conductor of the magnetoresistive element member 21B is connected to one end of the first conductor of the magnetoresistive element member 21B'. Accordingly, the magnetoresistive element members 21B and 21B' are connected in series with each other. The output terminal 12B is connected to a connecting point between the two magnetoresistive element members 21B, 21B'. One end of the first conductor of the magnetoresistive element member 21B is connected to a current supply terminal 13B which is in turn connected to the positive side of a power source such as a battery 14B. One end of the last conductor of the magnetoresistive element member 21B' is connected to a current supply terminal 15B which in turn is connected to the negative side of a power source such as a battery 16B. An output terminal 18B-1 is connected to the output terminal 12B and another output terminal 18B-2 is connected to a connecting point 17B between the negative side of the power battery 14B and the positive side of the power battery 16B. A B phase magnetic encoder output appears between the output terminals 18B-1 and 18B-2.

Since the conductor groups 20 of the magnetoresistive element 19 have the magnetoresistive effect, the resistance of the conductors 20 decreases in response to a component of the magnetic field acting in a direction parallel to the magnetic poles of a magnet rotor (identical to the magnet rotor 3 shown in FIG. 8).

The strength of this magnetic component is maximum at the border between two adjacent magnetic poles and is minimum or zero at the center of each individual magnetic pole, so that the magnetoresistive element members 19A and 19B each disposed over a range $(2n+1)\lambda$ changes the polarity upon rotation of the magnet rotor 3. Accordingly, the number of rotations of the magnet rotor 3 can be measured by counting the number of zero potential portions of an encoder output signal appearing between the output terminals 18A-1 and 18A-20 and the number of zero potential portions of an encoder output signal appearing between the output terminals 18B-1 and 18B-2.

According to the magnetoresistive element 19, each of the magnetoresistive element members 19A, 19B is composed of two magnetoresistive element members 21A, 21A' or 21B, 21B' and includes a plurality of conductors 20 extending over a width $n + \lambda/2$ where n is an integer greater than or equal to 0. Accordingly, two output signals obtained from the respective midpoints 20' of the magnetoresistive element members 19A, 19B are each composed of a group of signals having a small width which are out of phase and overlapped with each other within a range $n + \lambda/2$, each signal being identical to the output signal shown in FIG. 12(a) or FIG. 12(b).

In reality, the group of signal wave forms are integrated wave forms and the output signals appearing between the output terminals 18A-1, 18A-2 and 18B-1, 18B-2 have a trapezoidal wave form or a rectangular wave form.

Those portions of the thus obtained output signal wave forms which extend near the zero potential level are vary small as compared to the output signal wave forms shown in FIG. 10 and hence the output signal wave forms includes a small number of portions extending across the zero potential level. Accordingly, a measurement at the zero point is unlikely to contain an error even when a reference voltage fluctuates. Furthermore, the output signals are not susceptible to noise and hence the magnetoresistive element 19 can operate properly.

If the two encoder signal wave forms produced respectively from the magnetoresistive element member 19A for the A phase and the magnetoresistive element member 19B for the B phase which is shifted in phase by $n\lambda + \lambda/4$ with the magnetoresistive element member 19A are processed by the magnetic encoder signal processing circuit 8 shown in FIG. 11, then there are obtained two encoder signals 11-1, 11-2 as shown in FIG. 12(a) and FIG. 12(b), respectively. The encoder signals have different rectangular wave forms which are 90 degrees out of phase with each other. Therefore, by counting the encoder signals 11-1, 11-2 of the rectangular wave form, an angle of rotation of a magnetic encoder can be measured.

The incremental type magnetic encoder using the foregoing magnetoresistive element 19 is highly useful. However, the magnetoresistive element 19 is relatively large in size because two magnetoresistive elements 19A, 19B are disposed at a distance $n\lambda + \lambda/4$ where n is an integer greater than or equal to zero, for producing an A phase encoder signal and a B phase encoder signal. The magnetic encoder having such relatively large magnetoresistive element 19 is large in size and costly to manufacture.

With the foregoing drawbacks in view, a further attempt has been made by the present inventor to devise a magnetic encoder having a modified magnetoresistive element, described later on.

As shown in FIGS. 14 and 15, the modified magnetoresistive element 19' is to constructed as to produce an A phase encoder signal and a B phase encoder signal which is $\lambda/4$ out of phase with the A phase encoder signal ($\lambda$ is a width of each magnetic pole of a multipolar magnetic body). To this end, the magnetoresistive element 19' includes an A phase magnetoresistive element member 19A' and a B phase magnetoresistive element member 19B' which are overlapped in $\lambda/4$ out of phase relation with each other.

The B phase magnetoresistive element member 19B' is formed on an insulating base plate 26 of glass by a suitable method such as the vacuum evaporation method or the etching method, the base plate 26 being wider than the width of the magnetoresistive element member 19B'.

An insulating film 27 is laid over an upper surface of the B phase magnetoresistive element member 19B' for protecting the the magnetoresistive element member 19B'. The insulating film 27 having substantially the same size as the base plate 26.

The A phase magnetoresistive element member 19A' is formed on an upper surface of the insulating film 27 by a suitable method such as the vacuum evaporation or the etching.

The upper surface of the A phase magnetoresistive element member 19A' is covered with a protective insulating film 28. The insulating film 29 having substantially the same size as the insulating film 26 stated above.

The insulating films 27, 28 have a plurality (six in the illustrated embodiment) of cutout recesses 27a, 28a (FIG. 15) along one edge thereof so as to expose output terminals 12A, 12B and current supply terminals 13A, 13B, 15A, 15B. The recesses 27a in the insulating film 27 are staggered with the recesses 28a in the insulating film 28. The terminals 12A, 12B, 13A, 13B, 15A, 15B have respective widths and positions such that the upper terminals 12A, 13A, 15A do not overlap the lower terminals 12B, 13B, 15B, respectively.

The A phase magnetoresistive element member 19A' and the B phase magnetoresistive element member 19B' of the magnetoresistive element 19' have the same construction as those of the magnetoresistive element 19 described above with reference to FIG. 13 and hence a description is no longer necessary.

A magnetic encoder incorporating the magnetoresistive element 19' produces an encoder signal of the same preciseness as the encoder signal produced by the encoder having the magnetoresistive element 19. Further, since the magnetoresistive element members 19A' and 19B' are overlapped, as opposed to the side-by-side arrangement of the magnetoresistive element members 19A, 19B, the magnetoresistive element 19' is smaller in width than the magnetoresistive element 19 (actually, the width is cut down by half or more). Accordingly, the encoder having the magnetoresistive element 19' is compact in size and can be manufactured less costly.

The encoder using the magnetoresistive element 19' is highly useful as described above, however, it has drawbacks described below.

Since the A phase magnetoresistive element member 19A' and the B phase magnetoresistive element member 19A' are overlapped in $\lambda/4$ out of phase relation to one another, they have different air gaps and, therefore, different sensitivities. The difference in sensitivity exerts great influence on the output level of the magnetoresistive element 19. For example, it create a difference in the level of the output wave forms. As a consequence, a separate output level wave form correction means is needed, which increase the manufacturing cost of the magnetic encoder. The magnetoresistive element 19 is not well suited for mass production because the overlapping arrangement of the two magnetoresistive element members 19A', 19B' rises the production cost.

SUMMARY OF THE INVENTION

With the foregoing drawbacks in view, it is an object of the present invention to provide a magnetic encoder having a magnetoresistive element capable of producing an output signal of a wave form which is precise and independent of noise and fluctuation of a reference voltage, and is suitable for conversion into a digital signal.

Another object of the present invention is to provide a magnetic encoder incorporating a magnetoresistive element, which is compact in size and hence can be manufactured at a low cost, and is reliable in operation.

According to the present invention, a magnetic encoder includes a multipolar magnetic body having a row of alternate North and South poles of equal widths, and a magnetoresistive element disposed in confrontation to the multipolar magnetic body. The magnetoresistive element includes at least one A phase magnetoresistive element member and at least one B phase magnetoresistive element disposed in juxtaposition over $$\frac{(2n + 1)}{2} \cdot \lambda$$

where n is an integer greater than or equal to 0, and $\lambda$ is a width of each individual pole of the multipolar magnetic body. Each of the A phase magnetoresistive element member and the B phase magnetoresistive element member has a group of series connected linear conductors arranged side-by-side into a comb-like shape. The A phase magnetoresistive element member extends over $$\frac{(2n+1)}{4} \cdot \lambda,$$

and the B phase magnetoresistive element member is out of phase with the A phase magnetoresistive element member by $$\frac{(2n+1)}{4} \cdot \lambda.$$

According to a preferred embodiment, the number of the A phase magnetoresistive element member is two and the two A phase magnetoresistive element members are spaced by a distance equal to $$\frac{(2n+1)}{4} \cdot \lambda.$$

Likewise, the number of the B phase magnetoresistive element member is two and the two B phase magnetoresistive element members are spaced by a distance equal to $$\frac{(2n+1)}{4} \cdot \lambda.$$

One of the two A phase magnetoresistive element members constitutes an a phase magnetoresistive element member, the other of the two A phase magnetoresistive element members constituting an a' phase magnetoresistive element member and being connected in series with the a phase magnetoresistive element member. One of the two B phase magnetoresistive element members constitutes a b phase magnetoresistive element member, the other of the two B phase magnetoresistive element members constituting a b' phase magnetoresistive element member and being connected in series with the b phase magnetoresistive element member. A first output terminal is connected to a connecting point between the a and a' phase magnetoresistive element members for obtaining an A phase magnetic encoder signal. A second output terminal is connected to a connecting point between the b and b' phase magnetoresistive element members for obtaining a B phase magnetic encoder signal.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIGS. 3(a) and 3(b) are wave forms useful in explaining the operation of the magnetoresistive element shown in FIG. 1;

FIG. 4 is a wave form of an A phase magnetic encoder output signal produced from the magnetoresistive element shown in FIG. 1;

FIG. 5 is wave forms of A and B phase magnetic encoder output signals produced from the magnetoresistive element shown in FIG. 1;

FIG. 11 is a circuit diagram of a signal processing circuit including a conventional magnetoresistive element;

FIGS. 12(a) and 12(b) are wave forms of output signals produced from the magnetoresistive element shown in FIG. 11;

DETAILED DESCRIPTION

Figure 1:
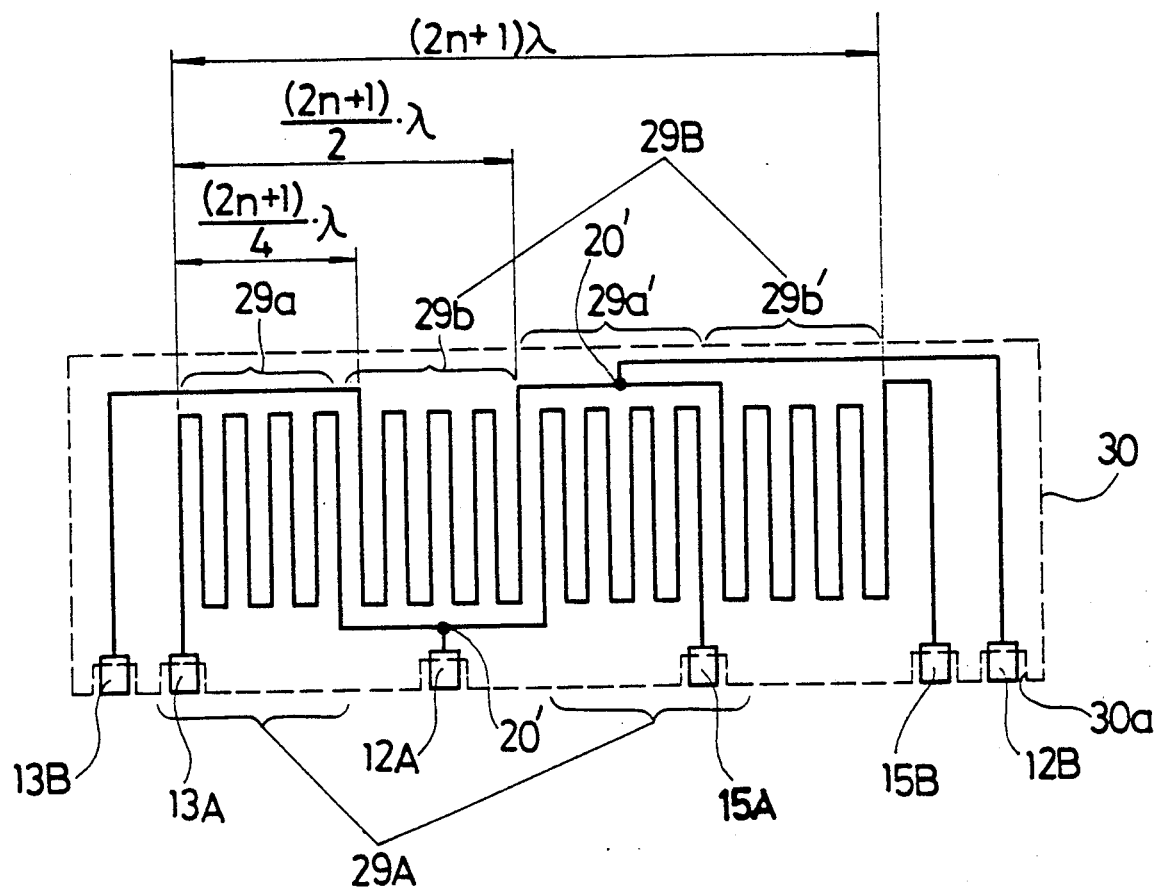
FIG. 1 is a schematic view illustrating a magnetoresistive element for a magnetic encoder according to the present invention.
Figure 2:
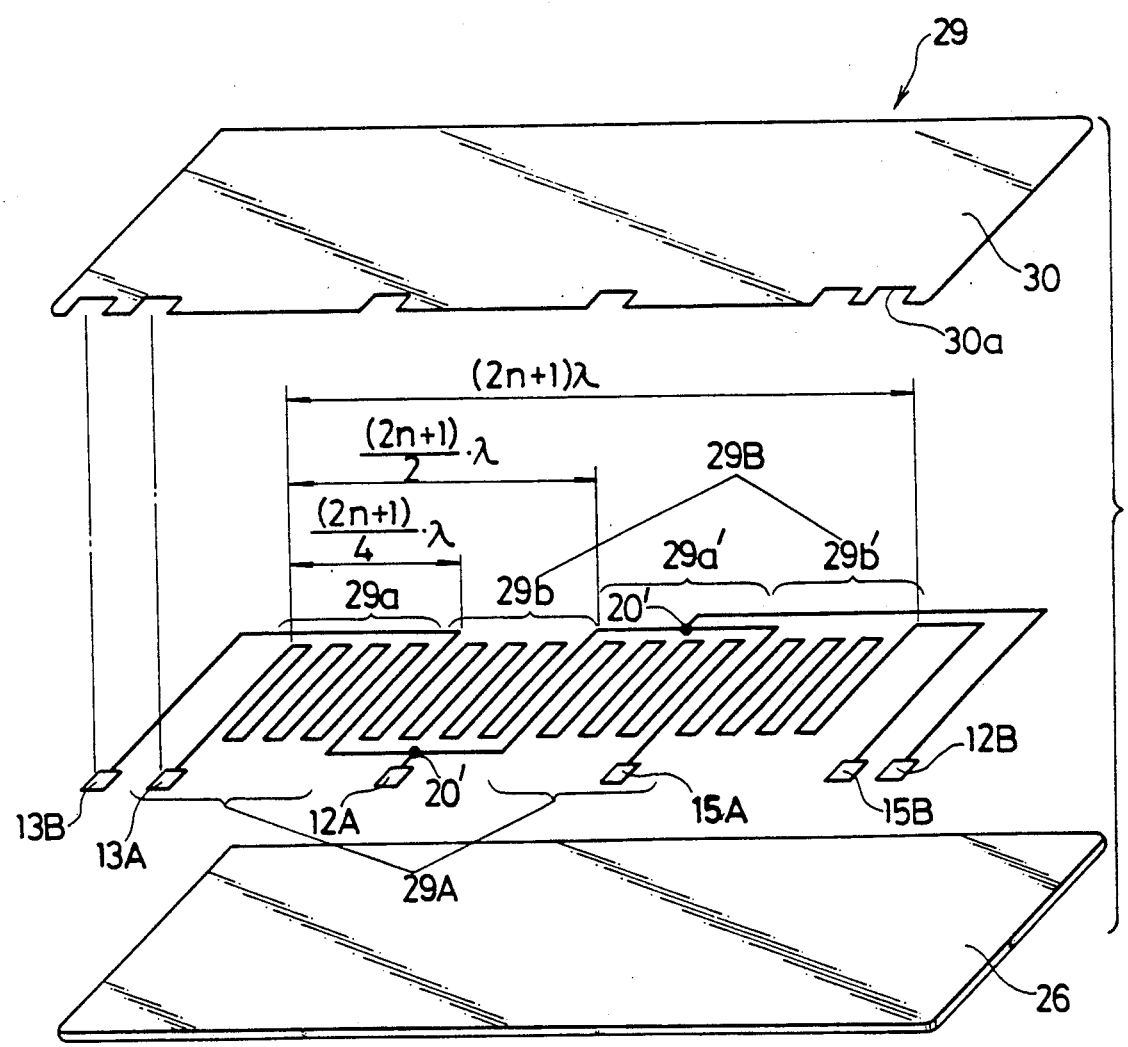
FIG. 2 is a exploded perspective view of the magnetoresistive element shown in FIG. 1.

FIGS. 1 and 2 illustrate a magnetoresistive element 29 for a magnetic encoder according to the present invention. The magnetoresistive element 29 includes a magnetoresistive element member 29A for producing an A phase encoder signal and a magnetoresistive element member 29B for producing a B phase encoder signal. The A phase magnetoresistive element member 29A is composed of a first magnetoresistive element member part 29a for an a phase, and a second magnetoresistive element member part 29a' for an a' phase Likewise, the B phase magnetoresistive element member 29B is composed of a first magnetoresistive element member part 29b for a b phase and a second magnetoresistive element member part 29b' for a b' phase.

Figure 6:
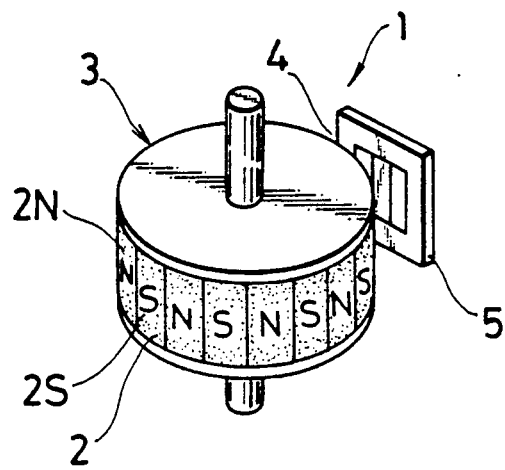
FIG. 6 is a schematic perspective view of a conventional incremental type rotary magnetic encoder.
Figure 7:
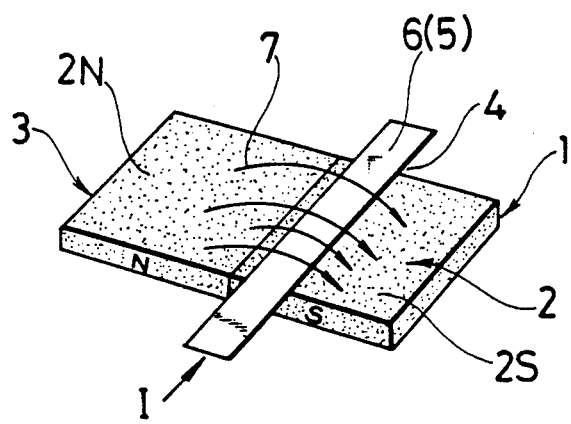
FIG. 7 is a schematic perspective view useful in explaining the principle of operation of a magnetoresistive element.
Figure 8:
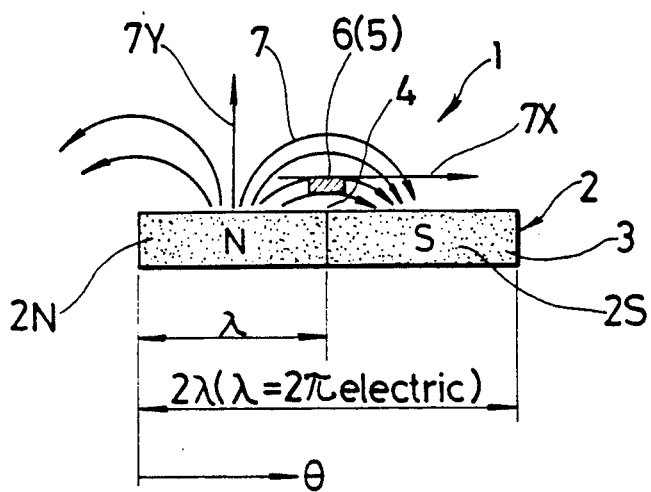
FIG. 8 is a schematic front elevational view of FIG. 7 illustrative of the relation between the magnetoresistive element and two adjacent poles of a multipolar magnetic body.
Figure 9:
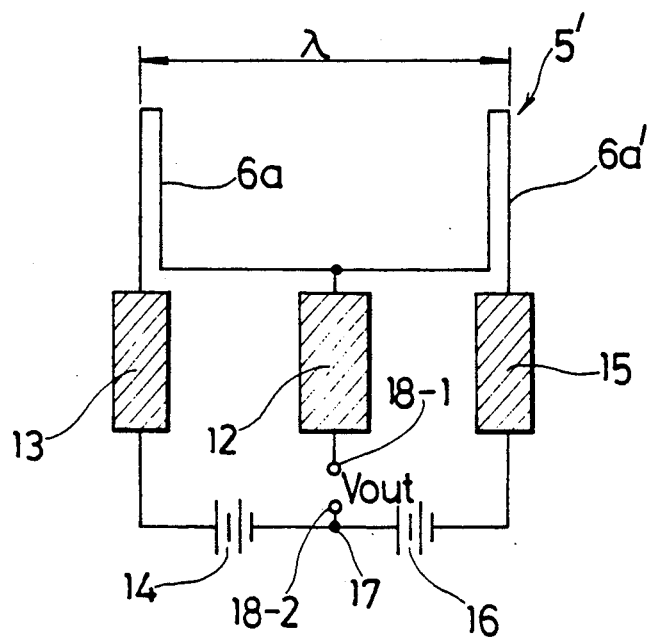
FIG. 9 is a schematic circuit diagram of a conventional magnetoresistive element.

The magnetoresistive element 29 is so constructed as to produce the B phase encoder signal which is out of phase with the A phase encoder by a distance $\lambda/4$ where $\lambda$ is a width of each pole of a multipolar magnetic body (identical to the multipolar magnetic body 3 shown in FIGS. 6 and 8, having a row of alternate North and South poles). To this end, each of the first and second magnetoresistive element member parts 29a, 29a' of the A phase magnetoresistive element member 29A is composed of a group of series connected linear conductors having the magnetoresistive effect and arranged side-by-side in a comb-like shape. Likewise, each of the first and second magnetoresistive element member parts 29b, 29b' of the B phase magnetoresistive element member 29B is composed of a group of series connected linear conductors having the magnetoresistive effect and arranged side-by-side into a comb-like shape. The four magnetoresistive element member parts 29a, 29a', 29b, 29b' are out of phase with each other by a distance $n\lambda/2 + \lambda/4$ where n is an integer greater than or equal to 0 (in the illustrated embodiment, n=0). The magnetoresistive element member parts 29a, 29a', 29b, 29b' are formed on an upper surface of an insulating base plate 26 (FIG. 2) of glass by a suitable process such as a vacuum evaporation method or an etching method.

Upper surfaces of the respective magnetoresistive element member parts 29a, 29a', 29b, 29b' are covered with a protective insulating film 30. The insulating film 30 has substantially the same size as the insulating base plate 26. With the insulating film 30 thus provided, the magnetoresistive element members 29A, 29B from damage.

Structural details of the magnetoresistive element 29 will be described below.

The a phase magnetoresistive element member part 29a, the b phase magnetoresistive element member part 29b, the a' phase magnetoresistive element member part 29a' and the b' phase magnetoresistive element member part 29b' are disposed side-by-side in the order as viewed from a 0° position. Each of the magnetoresistive element member parts 29a, 29b, 29a', 29b' extends over a distance equal to $n\lambda/2+\lambda/4$. In the illustrated embodiment, $n=0$ and hence the distance is $\lambda/4$. Accordingly, the magnetoresistive element member part 29a extends from the 0° position, the magnetoresistive element member part 29b extends from the $\lambda/4$ degrees position, the magnetoresistive element member part 29a' extends from the $\lambda/2$ degrees position, and the magnetoresistive element member part 29b' extends from the $(1+2)\cdot\lambda/4$ degrees position.

The insulating film 30 has a plurality (fix in the illustrated embodiment) of cutout recesses 30a along one longitudinal edge thereof so as to expose output terminals 12A, 12B and current supply terminals 13A, 13B, 15A, 15B. The recesses 30a are laterally spaced from one another and the terminals 12A, 12B, 13A, 13B, 15A, 15B have respective widths such that the adjacent terminals do not interfere with each other.

As shown in FIGS. 1 and 2, the a phase magnetoresistive element member part 29a of the A phase magnetoresistive element member 29A extends over a width of the multipolar magnetic body which is equal to $(2n+1)\cdot\lambda/4$ where n is an integer greater than 0 and $\lambda$ is a width of each individual pole of the multipolar magnetic body. In the illustrated embodiment, $n=0$ and hence the a phase magnetoresistive element member part 29a extends from the 0° position over a $\lambda/4$ width. The a phase magnetoresistive element member part 29a is composed of a plurality of series connected linear conductors 20 having the magnetoresistive effect and arranged side-by-side into a comb-like shape. The a' phase magnetoresistive element member part 29a' having the same conductors 20 as the a phase magnetoresistive element member part 29a is laterally spaced from the a phase magnetoresistive element member part 29a by a distance equal to $\lambda/4$ and hence it extends from the $\lambda/2$ degrees position over a $\lambda/4$ width. The a phase magnetoresistive element member part 29a is connected in series with the a' phase magnetoresistive element member part 29a' and the output terminal 12A is connected to a connecting point or the midpoint 20' between the magnetoresistive element member parts 29a and 29a'.

The b phase magnetoresistive element member part 29b of the B phase magnetoresistive element member 29B extends from the $\lambda/4$ degrees position over a $\lambda/4$ width. The b phase magnetoresistive element member part 29b is composed of a plurality of series connected linear conductors 20 having the magnetoresistive effect and arranged side-by-side into a comb-like shape. The b' phase magnetoresistive element member part 29b' having the same conductors 20 as the b phase magnetoresistive element member part 29b is laterally spaced from the b phase magnetoresistive element member part 29b by a distance equal to $\lambda/4$ and hence it extends from the $(1+2)\cdot\lambda/4$ degrees position over a $\lambda/4$ width. The b phase magnetoresistive element member part 29b is connected in series with the b' phase magnetoresistive element member part 29b' and the output terminal 12B is connected to a magnetoresistive element member parts 29b and 29b'.

The magnetoresistive element 29 of the foregoing construction is structurally equivalent to a magnetoresistive element having an A phase magnetoresistive element member 29A and a B phase magnetoresistive element member 29B each composed of a group of series connected conductors 20 and each shifted in phase with one of the magnetoresistive elements 29A, 29B by a distance equal to $\lambda/4$.

Figure 13:
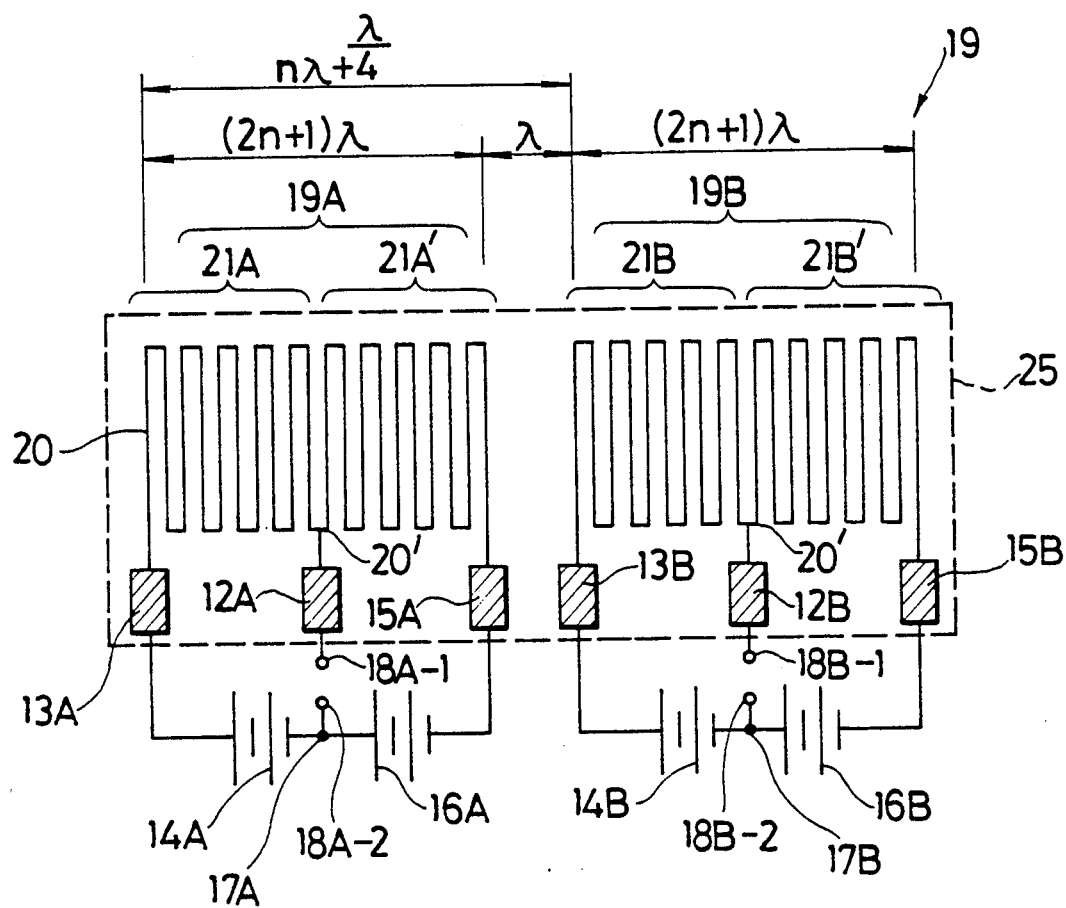
FIG. 13 is a schematic view illustrating a conventional magnetoresistive element proposed by the present inventor.

This arrangement of the magnetoresistive element 29 obviates the need for such a $(n\lambda+\lambda/4)$ out-of-phase arrangement of the A and B phase magnetoresistive element members which is required in the case of conventional magnetoresistive element 19 shown in FIG. 13. Accordingly, the magnetoresistive element 29 has a relatively small.

Figures 14A, 14B:
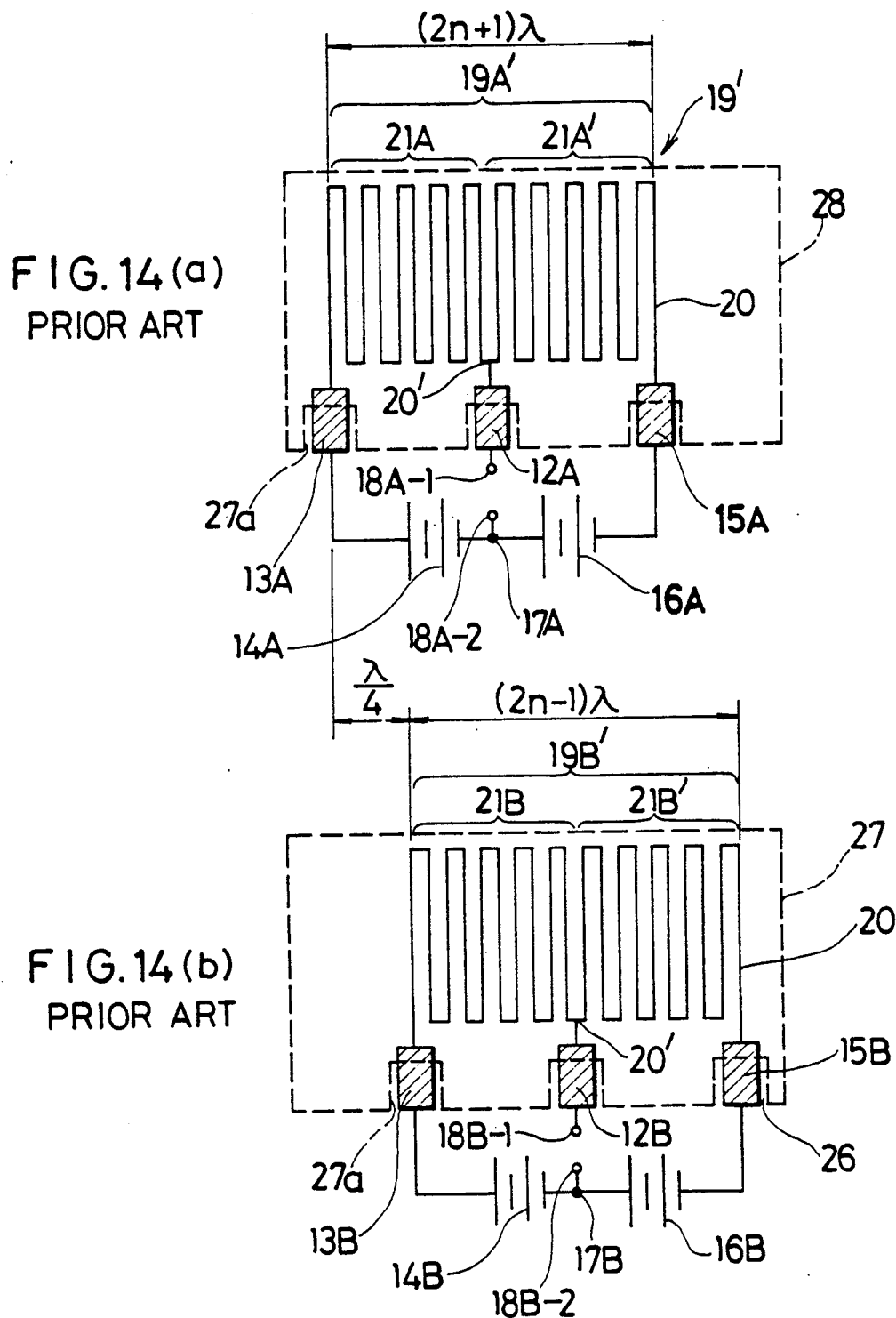
FIG. 14 is a schematic view illustrating another magnetoresistive element proposed heretofore by the present inventor.
Figure 15:
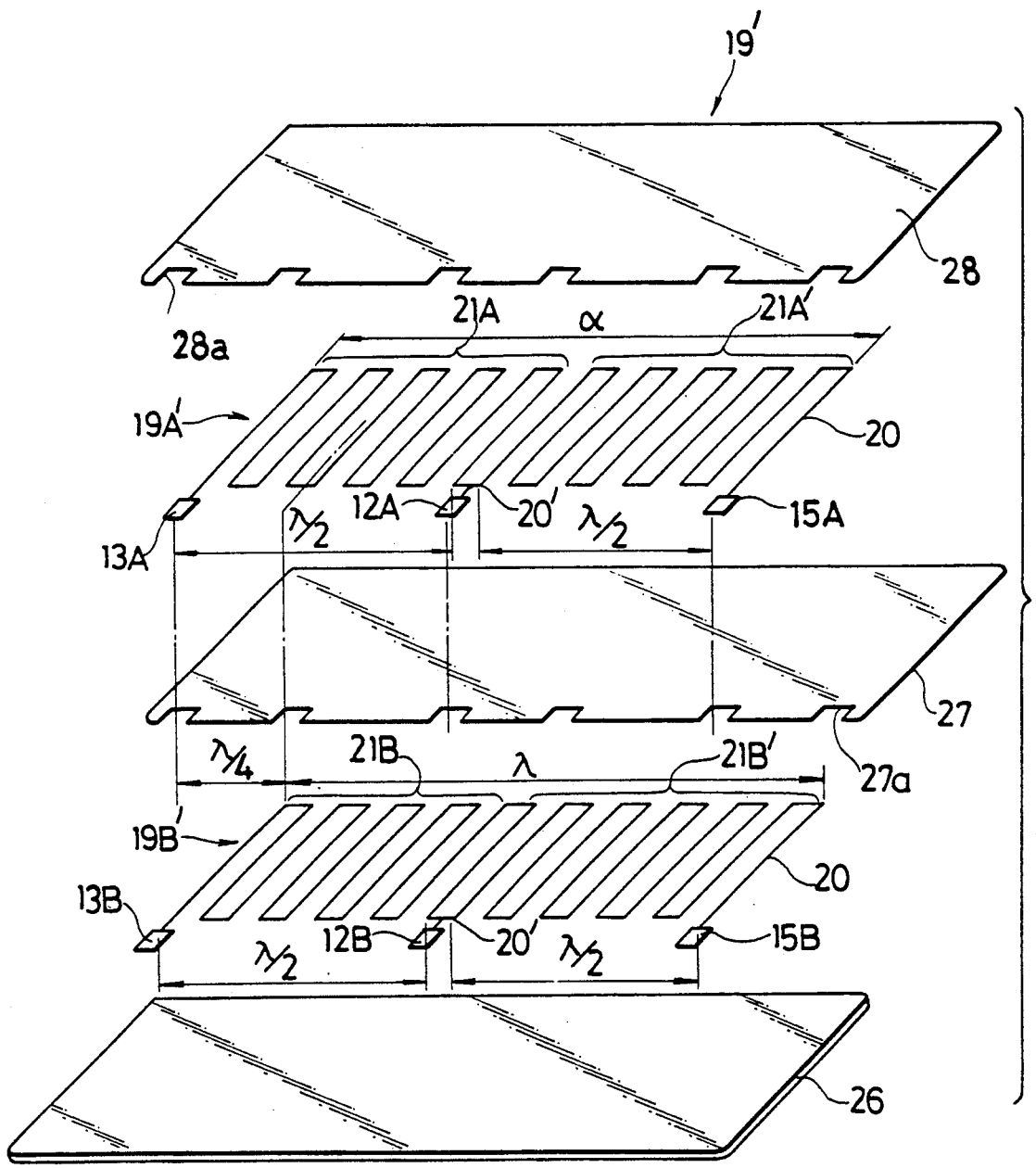
FIG. 15 is a schematic perspective view of the magnetoresistive element shown in FIG. 14.

The magnetoresistive element 29 of the foregoing construction dispenses with the need for such a $(n\lambda+\lambda/4)$ out-of-phase overlapped arrangement of the A and B phase magnetoresistive elements which is required in the case of the conventional magnetoresistive element 19' illustrated in FIGS. 14 and 15. The magnetoresistive element 29 is relatively thin and suited for mass production.

In the magnetoresistive element 29 of the foregoing construction, the a phase magnetoresistive element member part 29a and the a' phase magnetoresistive element member part 29a' are 180 degrees out of phase. Likewise, the b phase magnetoresistive element member part 29b and the b' phase magnetoresistive element member part 29b' are 180 degrees out of phase.

One end of the last conductor 20 of the a phase magnetoresistive element member part 29a is connected to one end of the first conductor 20 of the a' phase magnetoresistive element member part 29a'. Accordingly, the a and a' phase magnetoresistive element member parts 29a, 29a' are connected in series with each other. The output terminal 12A is connected to a connecting point 20' between the two magnetoresistive element member parts 29a, 29a'.

One end of the first conductor 20 of the a phase magnetoresistive element member part 29a is connected to the current supply terminal 13A which in turn is connected to the positive side of a power source such as a battery (not shown but identical to the power battery 14A shown in FIGS. 13 and 14). One end of the last conductor 20 of the a' phase magnetoresistive element member part 29a' is connected to the current supply terminal 15A which in turn is connected to the negative side of a power source such as a battery (not shown but identical to the power battery 16A shown in FIGS. 13 and 14).

Though not shown, an output terminal (identical to the output terminal 18A-1 shown in FIGS. 13 and 14) is connected to the output terminal 12A and another output terminal (identical to the output terminal 18A-2 shown in FIGS. 13 and 14) is connected to a connecting point (identical to the connecting point 17A shown in FIGS. 13 and 14) between the nagative side of the first-mentioned power battery and the positive side of the last-mentioned power battery. An A phase magnetic encoder output appears between these output terminals.

Likewise, one end of the last conductor 20 of the b phase magnetoresistive element member part 29b is connected to one end of the first conductor 20 of the b' phase magnetoresistive element member part 29b'. Accordingly, the b and b' phase magnetoresistive element member parts 29b, 29b' are connected in series with each other. The output terminal 12B is connected to a connecting point 20' between the two magnetoresistive element member parts 29b, 29b'.

One end of the first conductor 20 of the b phase magnetoresistive element member part 29b is connected to the current supply terminal 13B which in turn is connected to the positive side of a power source such as a battery (not shown but identical to the power battery 14B shown in FIGS. 13 and 14). One end of the last conductor 20 of the b' phase magnetoresistive element member part 29b' is connected to the current supply terminal 15B which in turn is connected to the negative side of a power source such as a battery (not shown but identical to the power battery 16B shown in FIGS. 13 and 14).

Though not shown, an output terminal (identical to the output terminal 18B-1 shown in FIGS. 13 and 14) is connected to the output terminal 12B and another output terminal (identical to the output terminal 18B-2 shown in FIGS. 13 and 14) is connected to a connecting point (identical to the connecting point 17B shown in FIGS. 13 and 14) between the nagative side of the first-mentioned power battery and the positive side of the last-mentioned power battery. An B phase magnetic encoder output appears between these output terminals.

Since the conductor groups 20 of the magnetoresistive element 29 have the magnetoresistive effect, the resistance of the conductors 20 decreases in response to a component of the magnetic field acting in a direction parallel to the magnetic poles of a multipolar magnet rotor (identical to the magnet rotor 3 shown in FIGS. 6 and 8).

The strength of this magnetic component is maximum at the border between two adjacent magnetic poles and is minimum or zero at the center of each individual magnetic pole, so that the magnetoresistive element members 29A and 29B change the polarity upon rotation of the multipolar magnet rotor 3. Accordingly, the number of rotation of the magnet rotor 3 can be measured by counting the number of zero potential points of encoder output signals appearing respectively between the output terminals (identical to the output terminals 18A-1, 18A-2 shown in FIGS. 13 and 14) and between the output terminals (identical to the output terminals 18B-1, 18B-2 shown in FIGS. 13 and 14).

According to the magnetoresistive element 29, each of the magnetoresistive element members 29A, 29B is composed of two magnetoresistive element member parts 29a, 29a' or 29b, 29b' each including a plurality of conductors 20 extending over a width λ/4. With the conductors 20 thus arranged, each of the magnetoresistive element member parts 29a, 29a', 29b, 29b' produces a group of output signals 22A, 22A', 23B or 23B' of a narrow sinusoidal wave form, as shown in FIGS. 3(a) and 3(b). The group of output signals 22A, 22A', 23B, 23B' are out of phase and overlap with each other, and they extend over a distance equal to λ/4. The output signals 22A and the output signals 22B are out of phase by λ/4. Likewise the output signals 22A' and the output signals 22B' are out of phase by λ/4.

In practice, the wave forms of the respective output signals 22A, 22A', 22B, 22B' are integrated wave forms and hence they are indicated by a composite wave form as indicated by dashed lines 23A, 23A', 23B, 23B' in FIGS. 3(a) and 3(b). As a result, the output signals 24A, 24A' and 24B, 24B' appearing respectively between the output terminals (identical to the output terminals 18A-1 and 18A-2 shown in FIGS. 13 and 14) and between the output terminals (identical to the output terminals 18B-1, 18B-2 shown in FIGS. 13 and 14) have a trapezoidal wave form (or a rectangular wave form), as shown in FIGS. 4 and 5. The output signals 24B, 24B' overlap the output signals 14A, 24A' and they are indicated by dashed lines for clarity.

Figure 10:
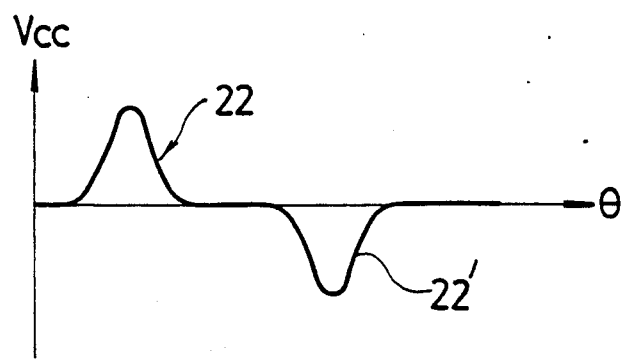
FIG. 10 is a wave form of an output signal produced from the magnetoresistive element shown in FIG. 9.

The output signals 24A, 24A', 24B, 24B' of the trapezoidal wave form are advantageous over the output signals 22, 22' shown in FIG. 10 in that the trapezoidal wave form is substantially free of portions extending parallel to or alongside the zero potential level and has a small number of crossing points with respect to the zero potential level at least number of crossing points. Accordingly, a measurement of the zero potential points can be achieved reliably without involving an error even when a reference voltage fluctuates. Furthermore, the output signals 24A, 24A , 24B, 24B' are resistant to noise and hence the magnetoresistive element 29 can operate properly.

As stated above, the output signals having the wave forms 24A and 24A' and the output signals having the wave forms 24B and 24B' are obtained respectively from the A phase magnetoresistive element member 29A and the B phase magnetoresistive element member 29B that are out of phase by λ/4. Accordingly, by processing the output signals with the magnetic encoder signal processing circuit 8 shown in FIG. 11, then there are obtained two encoder signals 11-1, 11-2 as shown in FIG. 12(a) and FIG. 12(b), respectively. The encoder signals have different rectangular wave forms which are 90 degrees out of phase with each other. Therefore, by counting the encoder signals 11-1, 11-2 of the rectangular wave form, an angle of rotation of a magnetic encoder can be measured.

As described above, the magnetoresistive element according to the present invention produces a trapezoidal voltage output wave form or a rectangular voltage output wave form which is easily be digitalized precisely without involving an error. Accordingly, an encoder having such a magnetoresistive element operates reliably and precisely. Since the total length of the series connected conductors is relatively large, the magnetoresistive element has a relatively large resistance. This means that the magnetic encoder consumes only a small amount of electric power and hence is suitable for use with a power supply unit comprising a battery.

Furthermore, the magnetoresistive element of this invention includes an A phase magnetoresistive element member and a B phase magnetoresistive element member arranged side-by-side, however, this side-by-side arrangement is structurally equivalent to an λ/4 out-of-phase, overlapped arrangement. Accordingly, the juxtaposed magnetoresistive element members, as opposed to the side-by-side arrangement of the magnetoresistive element members 19A, 19B shown in FIG. 13, does not enlarge the width of the magnetoresistive element. The magnetoresistive element of this invention is substantially half the width of the magnetoresistive element 19 shown in FIG. 13. Accordingly, the encoder having the magnetoresistive element of this invention is compact in size and can be manufactured less costly.

Obviously, various modifications and variations of the present invention are possible in the light of the above teaching. It is therefore to be understood that within the scope of the appended claims the invention may be practiced.

What is claimed is:

1. A magnetic encoder comprising:
   (a) a multipolar magnetic body having a row of alternate North and South poles of equal widths; and
   (b) a magnetoresistive element disposed in confrontation to said multipolar magnetic body, said magnetoresistive element including at least one A phase magnetoresistive element member and at least one B phase magnetoresistive element disposed in juxtaposition over $$\frac{(2n+1)}{2} \cdot \lambda$$

where n is an integer greater than or equal to 0, and $\lambda$ is a width of each individual pole of said multipolar magnetic body, each of said A phase magnetoresistive element members and said B phase magnetoresistive element member having a group of series connected linear conductors arranged side-by-side into a comb-like shape, said A phase magnetoresistive element member extending over $$\frac{(2n+1)}{4} \cdot \lambda,$$

said B phase magnetoresistive element member being out of phase with said A phase magnetoresistive element member by $$\frac{(2n+1)}{4} \cdot \lambda.$$

2. A magnetic encoder according to claim 1, the number of said A phase magnetoresistive element members being two and said two A phase magnetoresistive element members being spaced by a distance equal to $$\frac{(2n+1)}{4} \cdot \lambda,$$

the number of said B phase magnetoresistive element members being two and said two B phase magnetoresistive element members being spaced by a distance equal to $$\frac{(2n+1)}{4} \cdot \lambda,$$

one of the two A phase magnetoresistive element members constituting an a phase magnetoresistive element member, the other of the two A phase magnetoresistive element members constituting an a' phase magnetoresistive element member and being connected in series with said a phase magnetoresistive element member, one of the two B phase magnetoresistive element members constituting a b phase magnetoresistive element member, the other of the two B phase magnetoresistive element members constituting a b' phase magnetoresistive element member and being connected in series with said b phase magnetoresistive element member, further including a first output terminal connected to a connecting point between said a and a' phase magnetoresistive element members for obtaining an A phase magnetic encoder signal, and a second output terminal connected to a connecting point between said b and b' phase magnetoresistive element members for obtaining a B phase magnetic encoder signal.

* * * * *